(12) United States Patent
Tseng et al.

(10) Patent No.: US 11,222,821 B2
(45) Date of Patent: Jan. 11, 2022

(54) SEMICONDUCTOR DEVICE WITH REDUCED VIA BRIDGING RISK

(71) Applicant: Taiwan Semiconductor Manufacturing Co., Ltd., Hsin-Chu (TW)

(72) Inventors: Szu-Wei Tseng, Hsinchu (TW); Kuo-Chiang Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/881,406

(22) Filed: May 22, 2020

(65) Prior Publication Data
US 2020/0286783 A1    Sep. 10, 2020

Related U.S. Application Data

(63) Continuation of application No. 16/148,071, filed on Oct. 1, 2018, now Pat. No. 10,665,506.

(60) Provisional application No. 62/690,587, filed on Jun. 27, 2018.

(51) Int. Cl.
| | |
|---|---|
| *H01L 21/768* | (2006.01) |
| *H01L 23/522* | (2006.01) |
| *H01L 27/11* | (2006.01) |
| *H01L 21/311* | (2006.01) |

(52) U.S. Cl.
CPC .... *H01L 21/76897* (2013.01); *H01L 21/7684* (2013.01); *H01L 21/76816* (2013.01); *H01L 21/76831* (2013.01); *H01L 21/76877* (2013.01); *H01L 23/5226* (2013.01); *H01L 27/1104* (2013.01); *H01L 21/31105* (2013.01)

(58) Field of Classification Search
None
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |

(Continued)

*Primary Examiner* — Daniel Whalen
(74) *Attorney, Agent, or Firm* — Haynes and Boone, LLP

(57) ABSTRACT

First and second gates and first and second conductive contacts are disposed over a substrate. First and second vias are disposed over the first and second conductive contacts, respectively. A first gate contact is disposed over the first gate. A dielectric structure is disposed over the first gate and over the second gate. A first portion of the dielectric structure is disposed between the first and second vias. A second portion of the dielectric structure is disposed between the first via and the first gate contact. A first interface between the first conductive contact and the first via constitutes a first percentage of an upper surface area of the first conductive contact. A second interface between the first gate and the first gate contact constitutes a second percentage of an upper surface area of the first gate. The first percentage is greater than the second percentage.

20 Claims, 15 Drawing Sheets

(56) References Cited

U.S. PATENT DOCUMENTS

| | | |
|---|---|---|
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 10,665,506 B2 * | 5/2020 | Tseng ................ H01L 21/76831 |
| 2014/0001574 A1 | 1/2014 | Chen et al. |
| 2014/0110755 A1 | 4/2014 | Colinge |
| 2014/0151812 A1 | 6/2014 | Liaw |
| 2017/0053804 A1 * | 2/2017 | Lu .................... H01L 21/76834 |

* cited by examiner

SEMICONDUCTOR DEVICE WITH REDUCED VIA BRIDGING RISK

PRIORITY DATA

This application is a continuation of U.S. patent application Ser. No. 16/148,071, filed Oct. 1, 2018, entitled "Semiconductor Device With Reduced Via Bridging Risk", which claims priority from U.S. Provisional Patent Application No. 62/690,587, entitled "Semiconductor Device with Reduced via Bridging Risk" and filed on Jun. 27, 2018, the disclosures of which are incorporated herein in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, the shrinking distances between various semiconductor components may lead to bridging or electrical shorting problems, which would degrade semiconductor device performance or even cause device failures.

Therefore, although existing semiconductor fabrication methods have been generally adequate for its intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
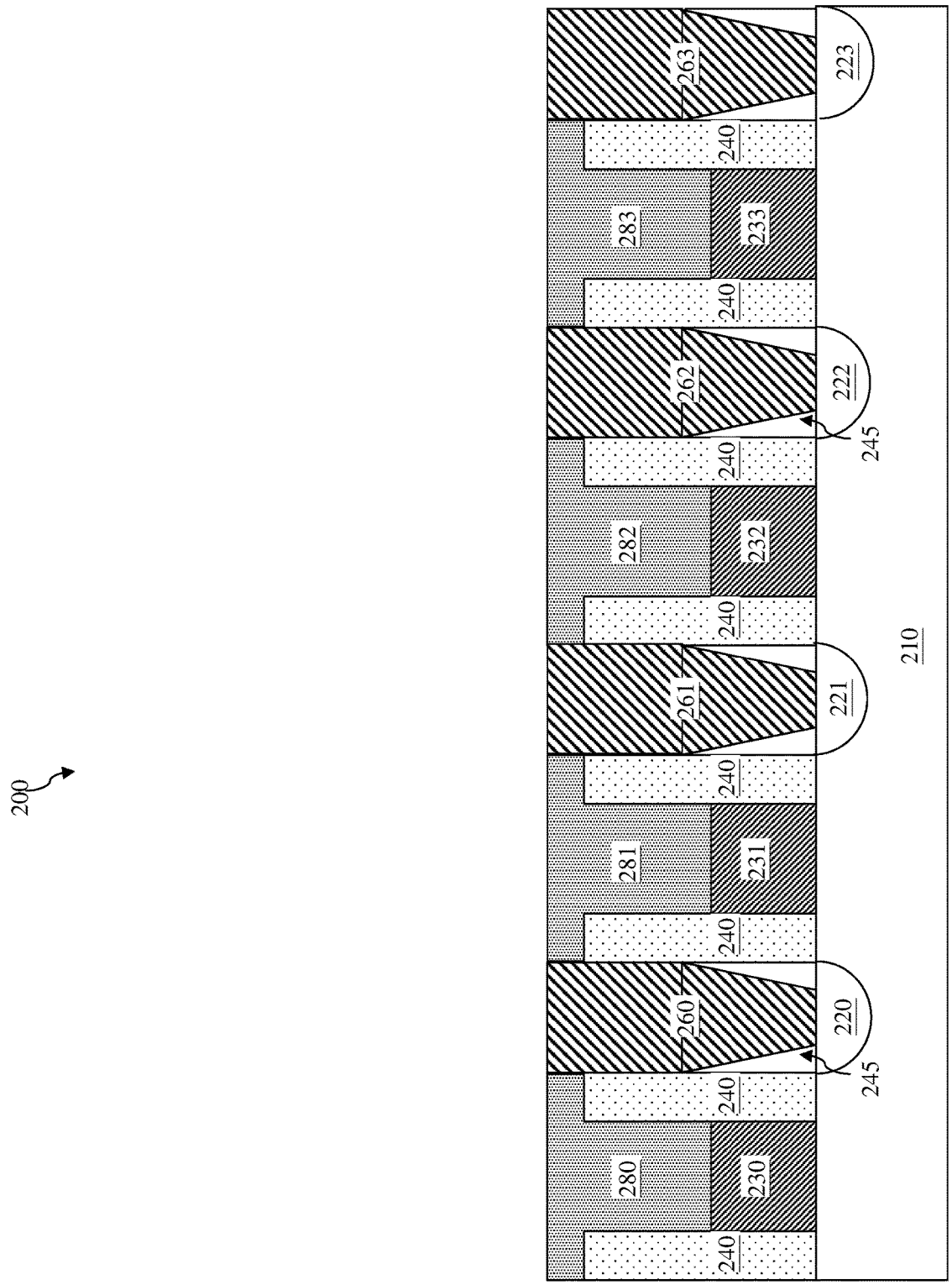
FIGS. 1-14 illustrate cross-sectional side views of a semiconductor device at various stages of fabrication according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As semiconductor technology nodes continue to shrink, challenges in fabrication arise. For example, as device sizes become smaller, bridging problems may occur, where components that should be kept electrically isolated from each other are unintentionally shorted together. Techniques such as overlay control to prevent bridging may place stringent demands on lithography, and yet they have not been able to sufficiently prevent the bridging problems. In comparison, the present disclosure utilizes a novel fabrication process flow to "self-align" the components and to automatically prevent the bridging problems, as discussed below in more detail.

FIGS. 1-14 are diagrammatic fragmentary cross-sectional side views of a semiconductor device 200 at various stages of fabrication in accordance with some embodiments. Referring now to FIG. 1, the semiconductor device 200 includes a substrate 210. The substrate 210 includes silicon in some embodiments. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may also include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). As examples, FIG. 1 illustrates a plurality of source/drain regions 220-223 formed in the substrate 210.

The substrate 210 may also include various electrical isolation regions. The electrical isolation regions provide electrical isolation between various device regions (such as the doped regions) in the substrate 210. The electrical isolation regions may include different structures formed by using different processing technologies. For example, the electrical isolation regions may include shallow trench isolation (STI) structures. The formation of an STI structure may include etching a trench in the substrate 210 and filling in the trench with one or more insulator materials such as silicon oxide, silicon nitride, silicon oxynitride, or combinations thereof. The filled trench may have a multi-layer structure such as a thermal oxide liner layer with silicon nitride filling the trench. A polishing or planarization process such as chemical mechanical polishing (CMP) may be performed to polish back excessive insulator materials and planarize the top surface of the isolation features.

The semiconductor device 200 includes a plurality of gate structures, for example gate structures 230-233 illustrated in FIG. 1. In some embodiments, the gate structures 230-233 are high-k metal gate structures—that is, the gate structures 230-233 each include a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The metal gate electrode is formed over the high-k gate dielectric. In some embodiments, the metal gate electrode may include a work function metal component and a fill metal component. The work functional metal component is configured to tune a work function of its corresponding transistor to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the gate electrode. In various embodiments, the fill metal component may contain Aluminum (Al), Tungsten (W), Copper (Cu), or combinations thereof.

The gate structures 230-233 may be formed using a gate replacement process. In that regard, a dummy gate electrode (e.g., a polysilicon gate electrode) is formed first over the high-k gate dielectric. The source/drain regions (such as the source/drain regions 220-223) of the transistor are formed in the substrate and on opposite sides of the dummy gate electrode. Thereafter, an interlayer dielectric (ILD) 245 is formed over the substrate and surrounds the dummy gate electrode therein. A polishing process such as chemical-mechanical-polishing (CMP) may be performed to planarize the upper surface of the ILD 245. The dummy gate electrode is then removed, leaving an opening in the ILD in place of the removed dummy gate electrode. The metal gate electrode is then formed in the opening. The above process may also be referred to as a gate last process. In some other embodiments, the formation of the high-k metal gate structures may also involve a high-k last process, where a dummy gate dielectric (e.g., silicon oxide) is first formed, and the dummy gate electrode is formed over the dummy gate dielectric. After the formation of the source/drain regions and the ILD, both the dummy gate dielectric and the dummy gate electrode may be removed to form an opening in the ILD 245. The high-k gate dielectric and the metal gate electrode are then formed in the opening.

Still referring to FIG. 1, gate spacers 240 are formed on the sidewalls of the gate structures 230-233. In some embodiments, each of the gate spacers 240 may include multiple layers, for example a layer containing silicon oxide and another layer containing silicon nitride. For reasons of simplicity, the detailed structures or shapes of the gate spacers are not specifically illustrated herein.

A plurality of conductive contacts 260-263 (also referred to as "MD" contacts) is formed over the source/drain regions 220-223, respectively, to provide electrical connectivity to the source/drain regions 220-223. The conductive contacts 260-263 may be formed by etching trenches in the ILD 245, and then performing one or more suitable deposition processes to fill the trenches, such as chemical vapor deposition (CVD), physical vapor deposition (PVD), atomic layer deposition (ALD), or combinations thereof, followed by a polishing process to planarize the surfaces of the conductive contacts 260-263. In some embodiments, the conductive contacts 260-263 contain a metal material, for example a metal material that contains tungsten, aluminum, copper, etc.

A plurality of "gate helmets" 280-283 are located over the gate structures 230-233, respectively. The gate helmets 280-283 contain a dielectric material. In some embodiments, the dielectric material is silicon nitride (SiN). The choice of using SiN as the gate helmet material is different from conventional processes, where other types of dielectric materials are typically chosen for gate helmets (if gate helmets are formed at all). In other embodiments, the gate helmets 280-283 may include a dielectric material such as $YSiO_x$, SiOC, $Al_2O_3$, $HfO_2$, $TiO_2$, $ZrSiO_4$, $HfSiO_4$, $Si_3N_4$, $Ta_2O_5$, SrO, $Y_2O_3$, $La_2O_3$, $LaLuO_2$, CaO, MgO, $Gd_2O_3$, $PrO_2$, $CeO_2$, $ZrHfO_2$, AlON, or combinations thereof. The gate helmets 280-283 are also located over the gate spacers 240. For example, the upper surfaces of the gate spacers 240 are in direct physical contact with portions of the gate helmets 280-283. Due to the presence of the gate spacers, the gate helmets 280-283 each have a T-shaped cross-sectional profile.

Figure 2:
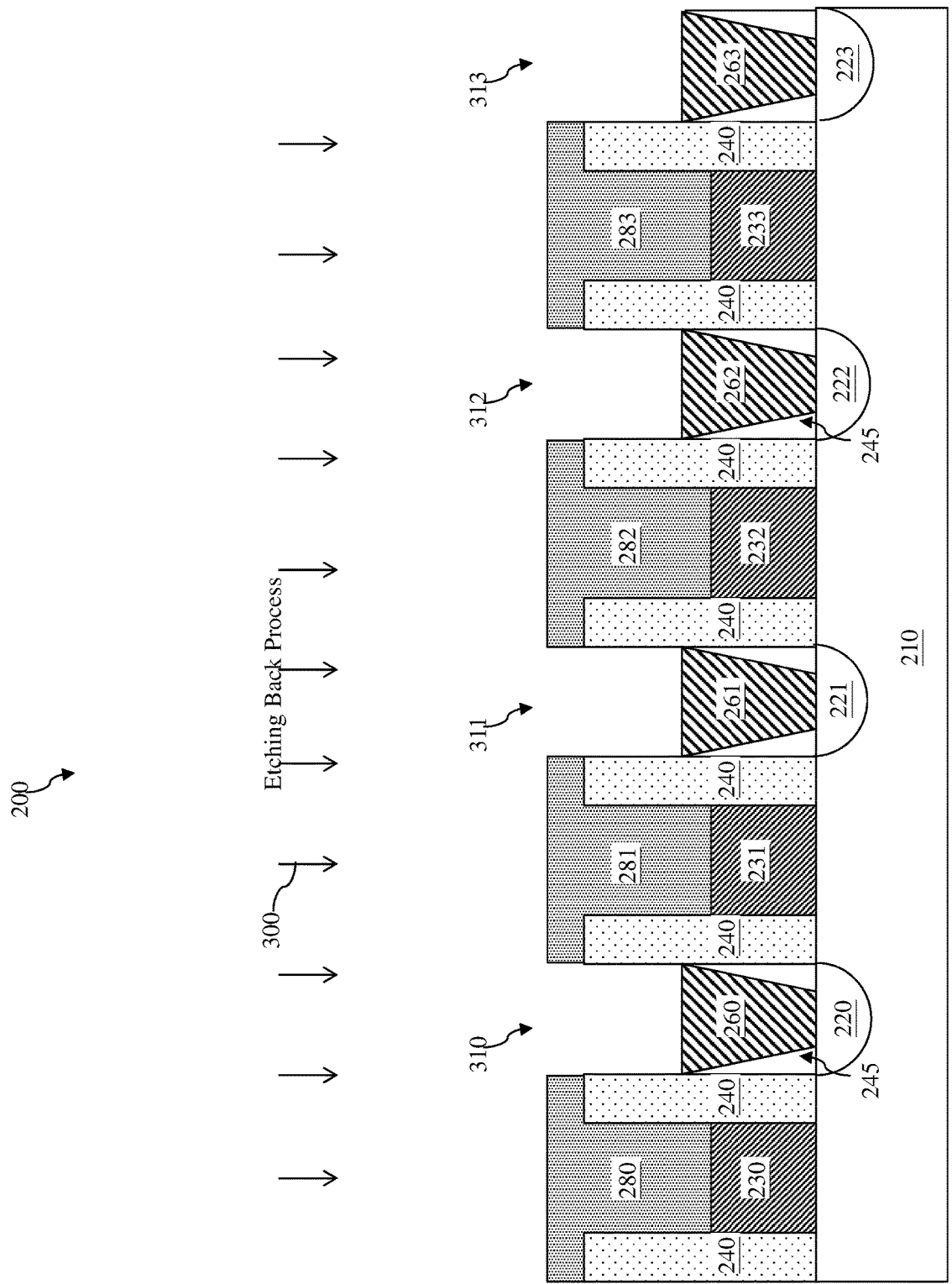

Referring now to FIG. 2, an etching back process 300 is performed to remove a portion of each of the conductive contacts 260-263, thereby forming openings 310-313 (also referred to as "tanks"), respectively, in placed of the partially removed conductive contacts. These openings 310-313 are reserved for the formation of conductive vias (also referred to as "VD" vias) above the conductive contacts 260-263, as discussed in more detailed below.

Figure 3:
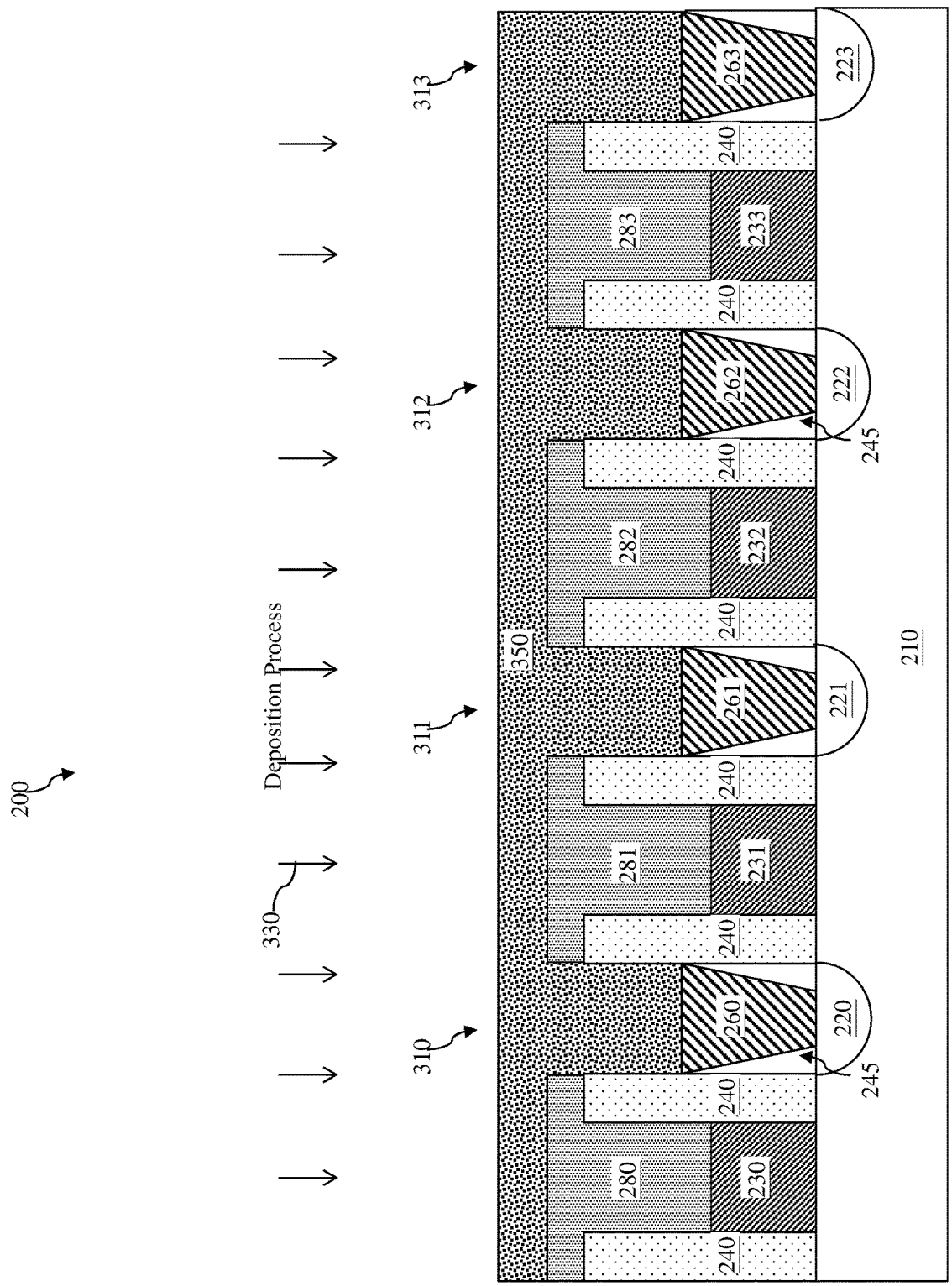

Referring now to FIG. 3, a deposition process 330 is performed to form a layer 350. The layer 350 is formed over the gate helmets 280-283 and the conductive contacts 260-263. Portions of the layer 350 also fill in the openings 310-313. The layer 350 may include a dielectric material that is different from the dielectric material of the gate helmets 280-283. In some embodiments, the layer 350 includes zirconium oxide ($ZrO_2$). In other embodiments, the layer 350 may include a dielectric material such as $YSiO_x$, SiOC, $Al_2O_3$, $HfO_2$, $TiO_2$, $ZrSiO_4$, $HfSiO_4$, $Si_3N_4$, $Ta_2O_5$, SrO, $Y_2O_3$, $La_2O_3$, $LaLuO_2$, CaO, MgO, $Gd_2O_3$, $PrO_2$, $CeO_2$, $ZrHfO_2$, AlON, or combinations thereof, so long as the layer 350 has an etching selectivity with the gate helmets 280-283. Portions of the layer 350 will be used as an etching stop layer in a later etching process, for example for the etching of vias, as discussed in more detail below.

Figure 4:
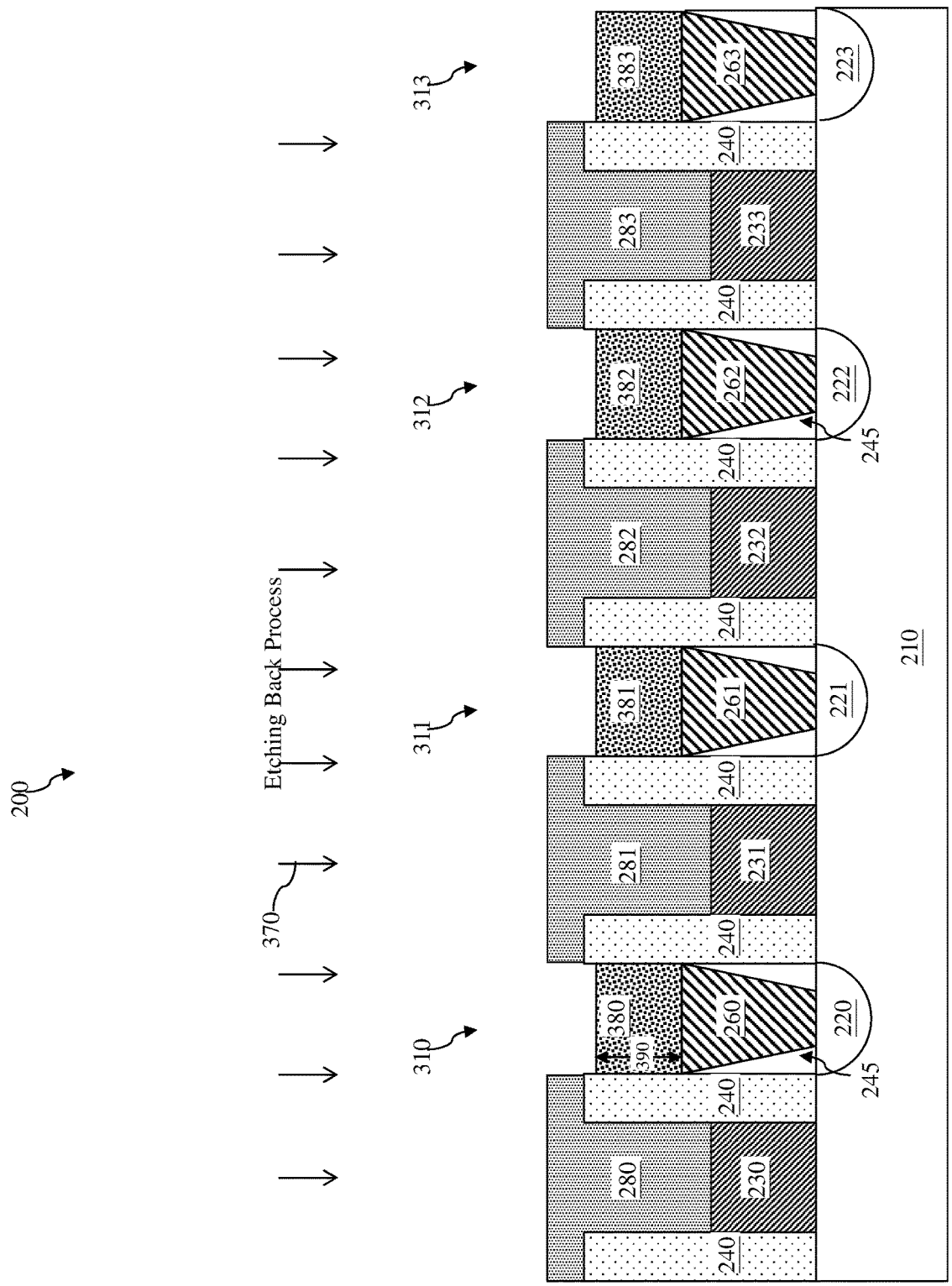

Referring now to FIG. 4, an etching back process 370 may be formed to partially remove the layer 350. For example, the portion of the layer 350 located over the gate helmets 280-283 is removed, as well as a portion of the layer 350 filling each of the openings 310-313. As a result, segments 380-383 of the layer 350 remain in the openings 310-313. Note that the etching back process 370 is performed such that the upper surfaces of the segments 380-383 are now located below the upper surfaces of the gate helmets 280-283. As shown in FIG. 4, the segments 380-383 each have a thickness 390. In some embodiments, the thickness 390 is in a range from about 8 angstroms to about 12 angstroms. At least some of the segments 380-383 may serve as an etching-stop layer for the etching of vias (e.g., the VD vias over the conductive contacts 260-261) in a later process. The range of the thickness 390 is configured such that the segments 380-383 can adequately serve their role as the etching-stop layer, for example thick enough to withstand the etching, but not too thick that they become difficult to remove later.

Figure 5:
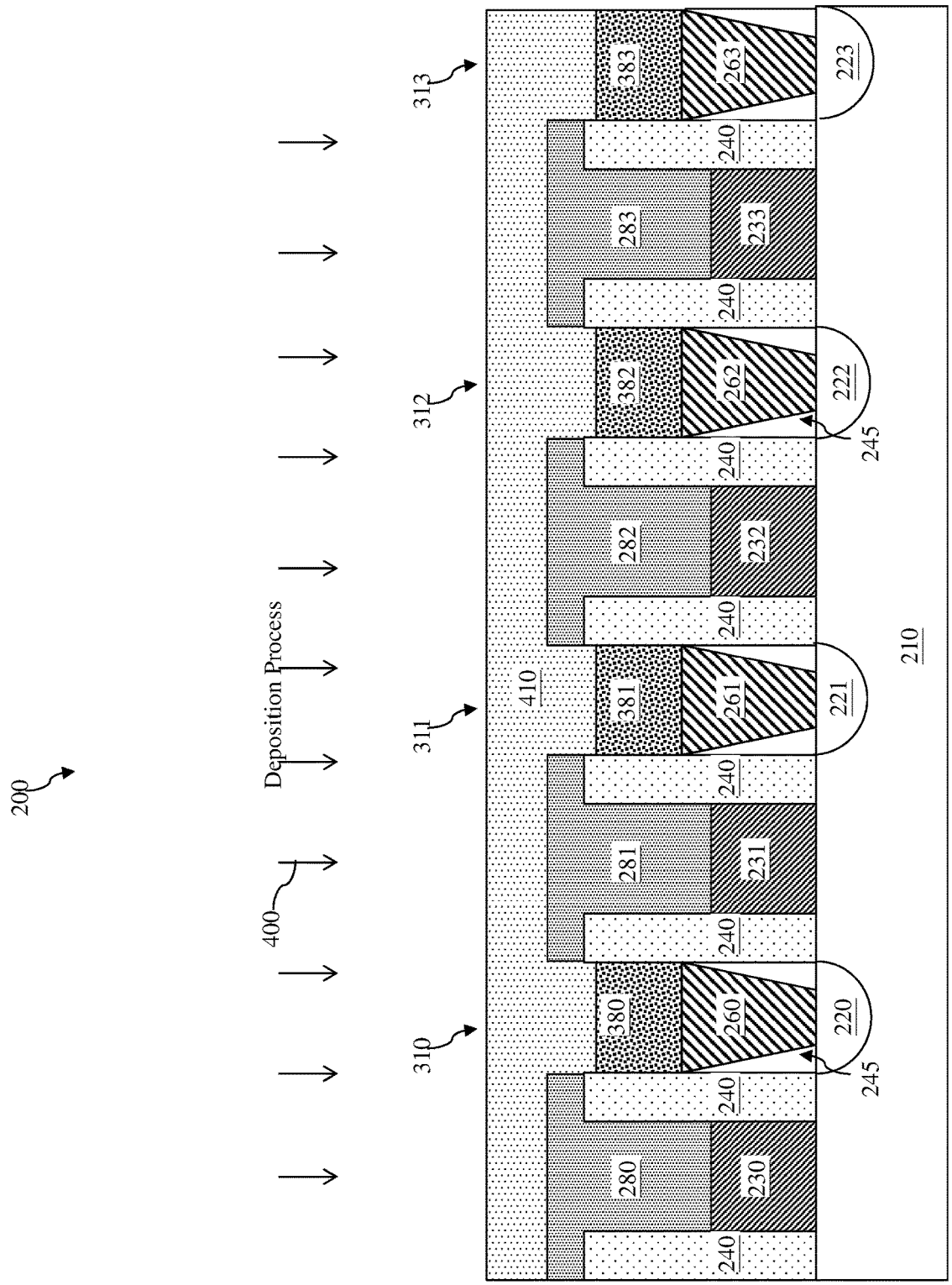

Referring now to FIG. 5, a deposition process 400 is performed to form a dielectric layer 410. The dielectric layer 410 is formed over the gate helmets 280-283 and the segments 380-383. Portions of the dielectric layer 410 also fill in the openings 310-313. The dielectric layer 410 may include a dielectric material that is different from the dielectric material of the gate helmets 280-283 and different from the material of the segments 380-383, such that an etching selectivity exists between these materials in one or more subsequent etching processes. In some embodiments, the dielectric layer 410 includes silicon oxide ($SiO_2$). The dielectric layer 410 serves as an etching layer (e.g., a layer where via openings are etched) for the vias to be formed.

Figure 6:
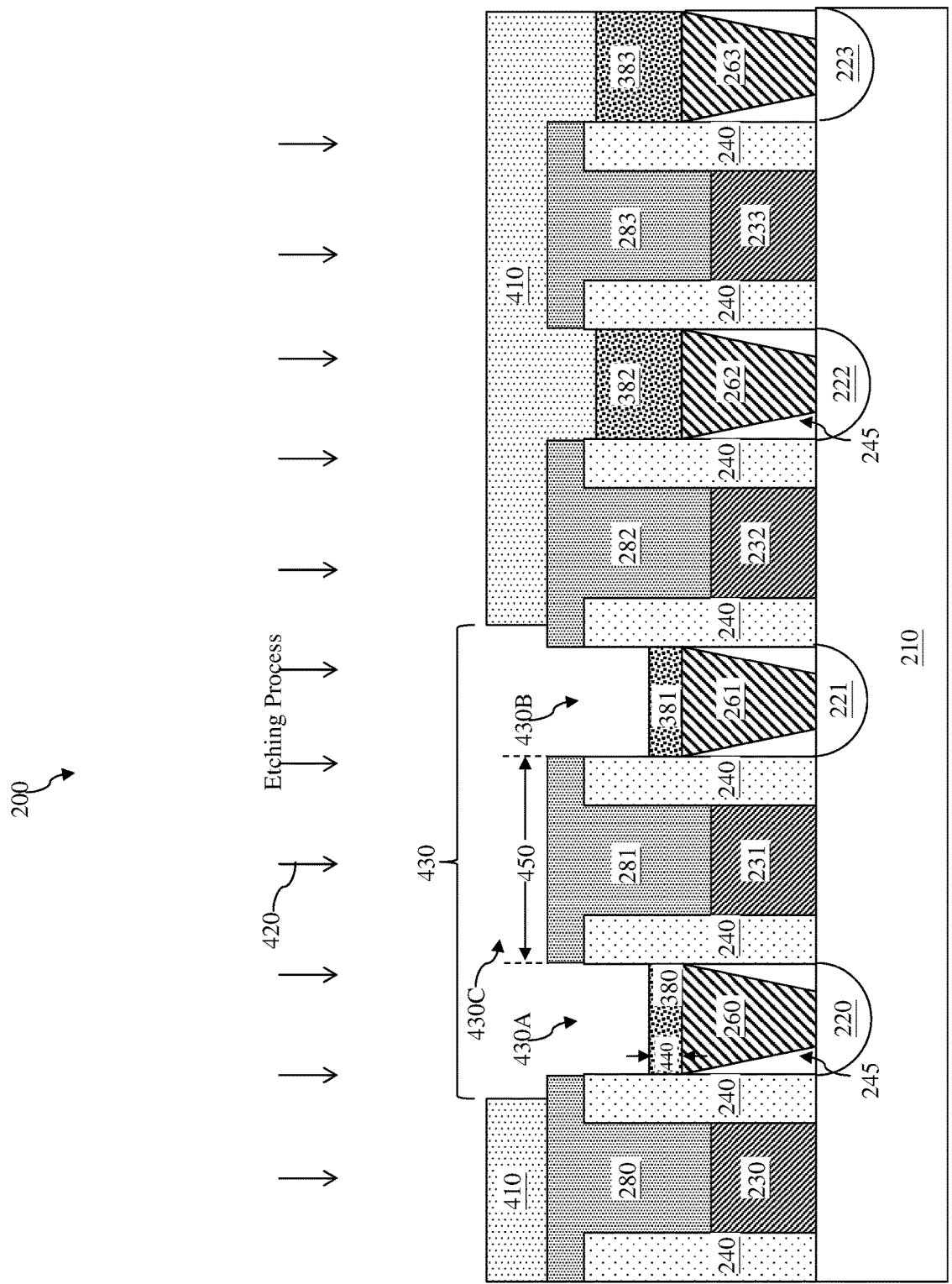

Referring now to FIG. 6, an etching process 420 is performed to etch an opening 430 in the semiconductor device 200. It is understood that the etching process 420 may involve forming a patterned photoresist layer over the layer 410. Using the patterned photoresist layer as an etching mask, the portions of the semiconductor device 200 exposed by the photoresist layer are etched by the etching process 420. The opening 430 vertically extends through a portion of the dielectric layer 410 and exposes the gate helmet 281 and portions of the gate helmet 280 and 282, as well as the segments 380 and 381. The opening 430 will be filled with a conductive material later to form VD vias above the conductive contacts 260-261.

It will become more apparent based on the later discussions that forming the opening 430 allows self-aligned vias to be formed over the conductive contacts 260-261. This is because the opening 430 is formed to be wide enough to laterally cover both the conductive contacts 260-261, and thus any vias formed within the opening 430 will automatically be self-aligned with their respective conductive contacts. This is advantageous over conventional methods of defining via holes, where individual vias are defined separate from one another to be aligned with their respective conductive contacts underneath. In doing so, conventional methods place a strict requirement on overlay control (to make sure the via holes and the conductive contacts align vertically) as well as lithography capabilities (to make sure that the via holes do not bridge with each other).

Still referring to FIG. 6, the segments 380-381 herein serve as an etching stop layer during the etching process 420, since the material of the segments 380-381 is tuned to have an etching selectivity (e.g., an etching selectivity greater than 10:1) with the dielectric layer 410. In other words, the dielectric layer 410 has a substantially greater etching rate during the etching process 420, while the segments 380-381 have a substantially lower etching rate during the etching process 420. For example, in some embodiments, the difference in the etching rates may be greater or equal to 10:1. As such, the etching process 420 may etch away the exposed portions of the dielectric layer 410 but may be "stopped" by the segments 380-381.

Nevertheless, since the etching selectivity cannot be infinitely high, the thickness of the segments 380 and 381 may be slightly reduced by the etching process 420 as well. For example, the segments 380-381 after the performance of the etching process 420 each have a thickness 440 that is smaller than the thickness 390 (see FIG. 4) before the etching process 420 is performed. In some embodiments, the thickness 440 is in a range from about 3 nanometers (nm) to about 7 nm. As can be seen from FIG. 6, the segments 380-381 are substantially thinner than the segments 382-383 (which are un-etched) after the etching process 420. It is understood that the segments 380-381 protect the conductive contacts 260-261 therebelow from being damaged by the etching process 420.

As shown in FIG. 6, the opening 430 includes a portion 430A and a portion 430B that are located directly above the conductive contacts 260 and 261, respectively. The VD vias for providing electrical connectivity to the conductive contacts 260-261 will be formed in these portions 430A and 430B. The portions 430A and 430B are separated by a distance 450, which is the distance between adjacent conductive contacts. The distance 450 may be quite small (e.g., less than about 33 nm in some embodiments). Due to lithography constraints when the distance 450 becomes small, it may be difficult to define the portions 430A and 430B separately, and thus the portions 430A-430B are also joined together by a portion 430C of the opening 430 located above the portions 430A-430B. In other words, had the distance 450 been sufficiently great, the portions 430A and 430B could have been defined as separate via openings, and a portion of the layer 410 could have been preserved between the portions 430A and 430B of the opening 430, which would have provided electrical isolation between the VD vias. However, as the distance 450 shrinks, the two portions 430A and 430B of the opening 430 may be merged together even if they were designed to be defined as separate via openings. It is understood that the present disclosure may define a big opening 430 to purposely merge the portions 430A-430B in some embodiments, or that the merging of the portions 430A-430B may not be necessarily by design, but due to lithography constraints.

Regardless, the merging of the portions 430A-430B could have otherwise created a bridging problem between the VD vias, as the conductive material filling the portion 430C may bridge the VD vias together. Bridging problems similar to this may plague conventional fabrication processes, which does not utilize the fabrication process flow discussed above with reference to FIGS. 1-6 and as such will have differently-looking structures. Stated differently, adjacent VD vias fabricated according to conventional process flows may have a significant risk of bridging when the distance separating them becomes too small, though it is understood that their structures are different from what is shown in FIG. 6. As an example, conventional processes may not be intentionally trying to form an opening similar to the opening 430 that would lead to bridging between the two portions 430A-430B. Rather, the conventional processes may attempt to define the via openings to be separate from each other, but due to lithography limitations, the two via opening may end up merging together, similar to the case of the opening 430.

In comparison, bridging of the adjacent VD vias is not a problem in the present disclosure, even if the distance 450 separating the portions 430A and 430B may be small. For example, a subsequent polishing process will polish away the conductive material filling the portion 430C, which would effectively "cut off" the connection between the VD vias formed in the portions 430A and 430B. Again, it is understood that the present disclosure allows the opening 430 to be defined as a "big" opening that laterally spans the conductive contacts 260-261 in some embodiments, but it also allows two via openings (e.g., similar to the portions 430A-430B) to be defined separately, knowing that if a merging of these two via openings occurs, then the result would still be similar to having the "big" opening 430 defined in the first place, and the end result should be the same, which is no bridging between the adjacent vias.

As discussed above, another benefit of the process flow of the present disclosure is that the VD vias will be formed to be "self-aligned" with the conductive contacts 260-261. For example, in some embodiments, a sufficiently wide opening (such as the opening 430) may be defined to laterally cover both the conductive contacts 260-261. As such, once the segments 380-381 are removed in a later process, the VD vias are formed on the entire upper surface of conductive contacts 260-261. Such an interface between the conductive contacts 260-261 and the VD vias is much greater than the interface between the conductive contacts and the VD vias in conventional processes. For example, conventional processes would have needed complex overlay control to separately define the VD via openings to align with the conductive contacts below, and as a result only a portion of the upper surface of the conductive contact may be in direct contact with the VD via formed thereon. The greater via-to-contact interface offered by the present disclosure improves device performance, for example less electrical resistivity.

Figure 7:
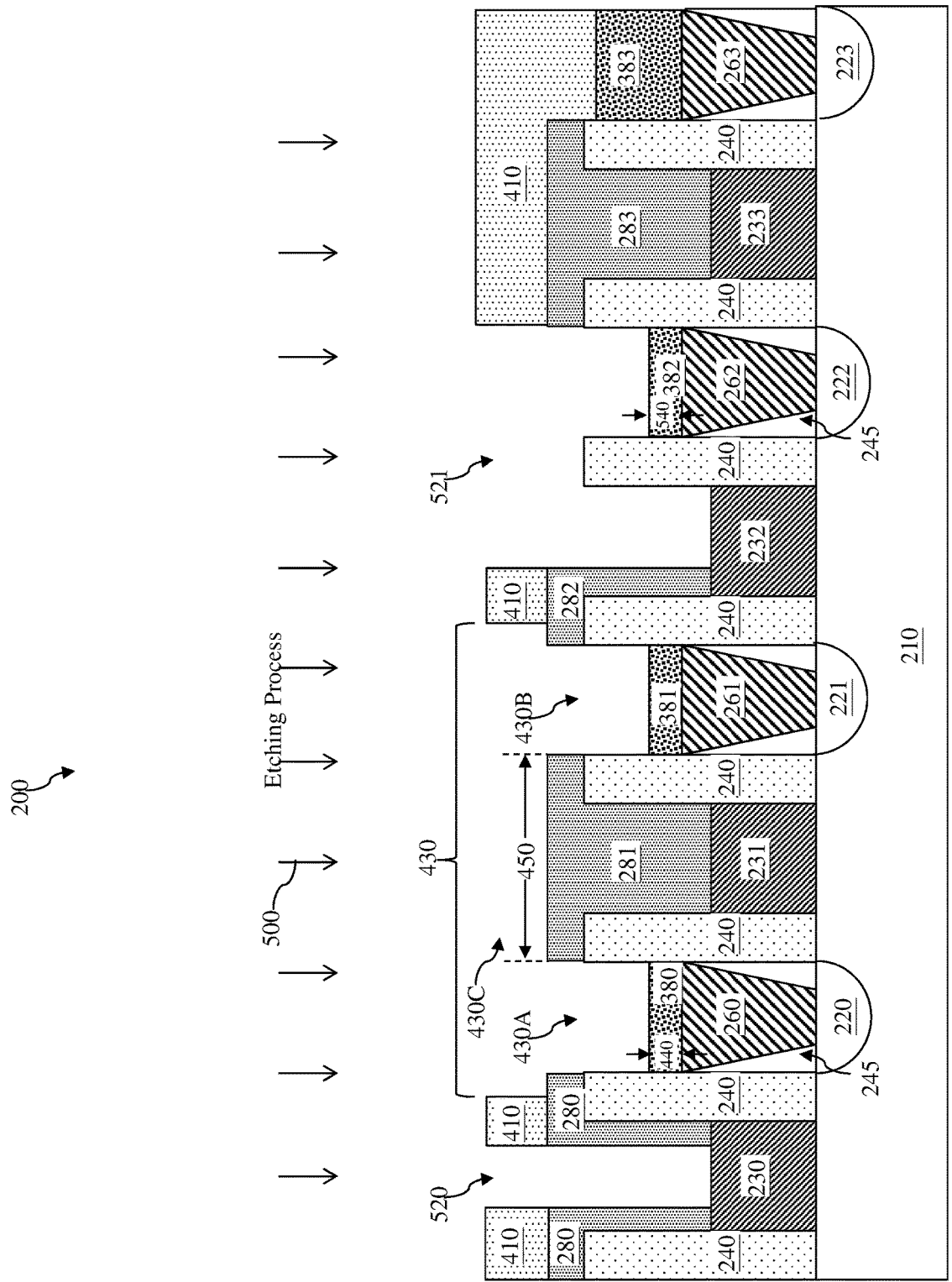

Referring now to FIG. 7, an etching process 500 is performed to the semiconductor device 200. The etching process 500 is configured to etch openings 520-521 that each vertically extend through the layer 410 and the gate helmets 280 and 282. For example, a patterned photoresist layer may be formed over the semiconductor device 200, where the patterned photoresist layer defines openings 520-521. As the etching process 500 is performed, the patterned photoresist layer serves as an etching mask, so that the materials exposed by the openings are etched.

As discussed above, due to the different material compositions between the segments 380-383, the layer 410, and the gate helmets 280-283, the etching process 500 can etch through the layer 410 and the gate helmets 280 and 282 (while the gate helmet 281 is being protected by the patterned photoresist layer) without completely etching through the segment 382. Nevertheless, the segment 382 has a reduced thickness 540 after the etching process 500 is performed. In some embodiments, the thickness 540 is similar in value to the thickness 440, for example in a range from about 3 nm to about 7 nm. It is understood that the segment 382 protects the conductive contact 262 therebelow from being damaged by the etching process 500.

The openings 520-521 are reserved for gate contacts (or vias) to be formed over the gate structures 230 and 232, and as such the openings 520-521 may also be referred to as gate contact openings. The opening 520 is aligned with and exposes a portion of the gate structure 230, and it is reserved for the formation of a "regular" gate contact (or via) VG and may be referred to as a VG opening. In comparison, the opening 521 is aligned with the gate structure 232 and the conductive contact 262, and it is reserved for the formation of a "slot" contact, also referred to as a body contact or a linking contact. The slot contact may be implemented in certain IC applications such as Static Random Access Memory (SRAM) devices. In other words, the slot contact to be formed in the opening 521 is meant to electrically interconnect the gate structure 232 and the conductive contact 262 together, and thus the "bridging" between the gate structure 232 and the conductive contact 262 is by design, rather than a defect.

It is understood that although one VG opening 520 is illustrated in FIG. 7 for simplicity, the etching process 500 actually may form a plurality of other VG openings, some of which may be adjacent to one another. Similar to the VD via openings discussed above, when the distance between these VG openings are too small, it could create a bridging risk (e.g., bridging between adjacent VG contacts) in conventional devices. For example, referring to FIG. 8, the cross-sectional view of a different portion of the semiconductor device 200 is shown. Source/drain regions 224-225 similar to the source/drain regions 220-223 are formed in the substrate 210. Gate structures 234-236 (with gate spacers 240 formed on the sidewalls) similar to the gate structures 230-233 are formed over the substrate 210. Conductive contacts 264-265 similar to the conductive contacts 260-263 are formed over the source/drain regions 224-225, respectively. Gate helmets 284-286 (or remnants thereof) similar to the gate helmets 280-283 are formed over the gate structures 234-236. Segments 384-385 (of the dielectric layer 350) similar to the segments 380-383 are formed over the conductive contacts 264-265, respectively. The layer 410 is formed over the gate helmets 284-286 and over the segments 384-385.

Figure 8:
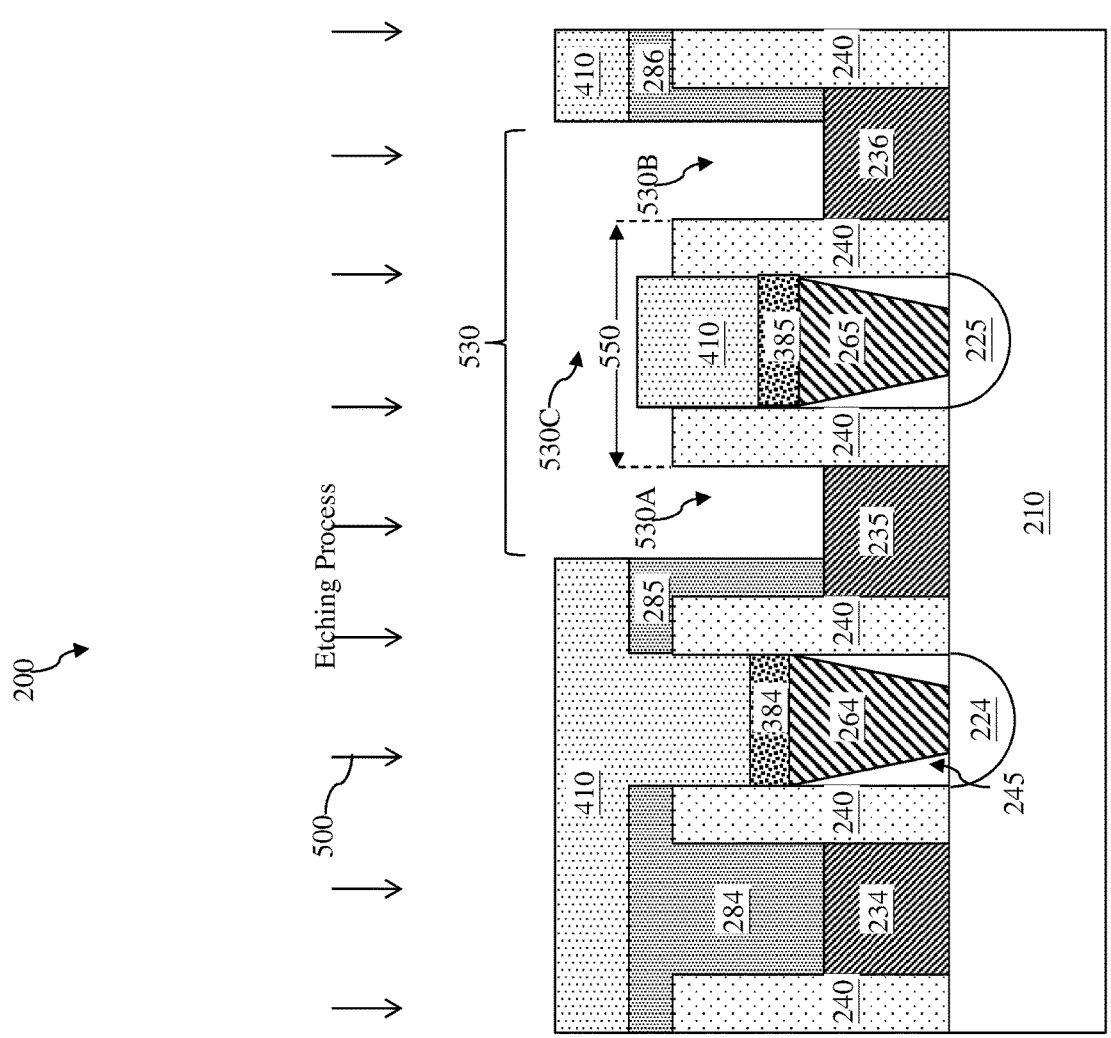

It is understood that the portion of the semiconductor device 200 shown in FIG. 8 has undergone the same fabrication processes discussed above, such as the etching back process 300 of FIG. 2, the deposition process of 330 of FIG. 3, the etching back process 370 of FIG. 4, the deposition process 400 of FIG. 5, the etching process 420 of FIG. 6 (though no VD opening is actually formed, since the portion of the semiconductor device 200 in FIG. 8 may be protected by the patterned photoresist layer), and the etching process 500 of FIG. 7. In addition to etching the openings 520-521 as shown in FIG. 7, the etching process 500 etches an opening 530 as shown in FIG. 8. The opening 530 includes a portion 530A, a portion 530B, and a portion 530C. The portions 530A and 530B expose a portion of the gate structure 235 and a portion of the gate structure 236, respectively. The portions 530A and 530B define openings for the gate contacts for the gate structures 235-236. The portion 530C joins the portions 530A-530B together. Similar to the case of VD openings 430A-430B discussed above, when a distance 550 between adjacent gate structures 235-236 becomes too small, it would have created a bridging risk between adjacent gate contacts for conventional processes. Here, the gate contact bridging risks are substantially eliminated by the unique fabrication process flow, for reasons similar to those discussed above in association with the via openings.

Figure 9:
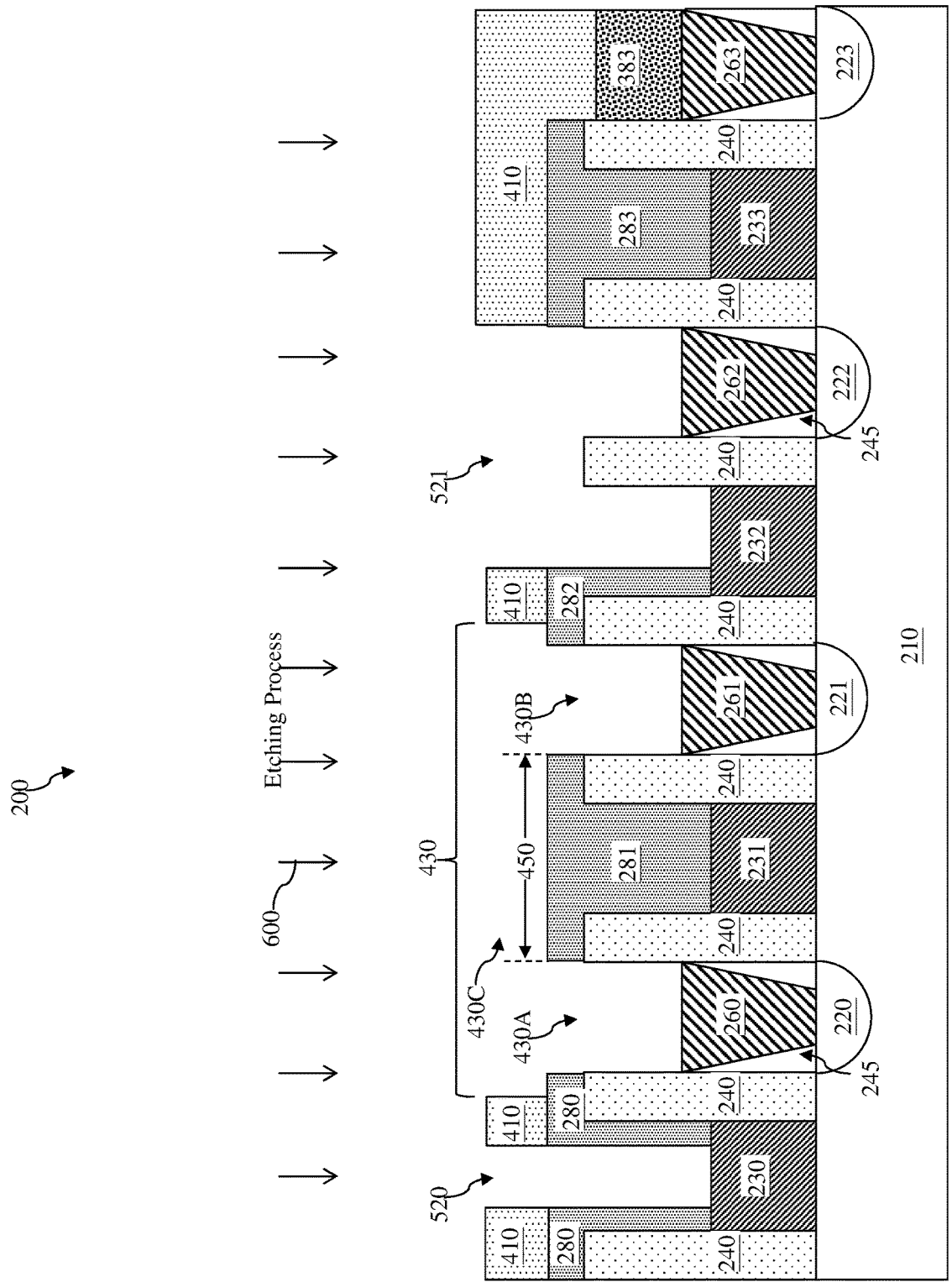
Figure 10:
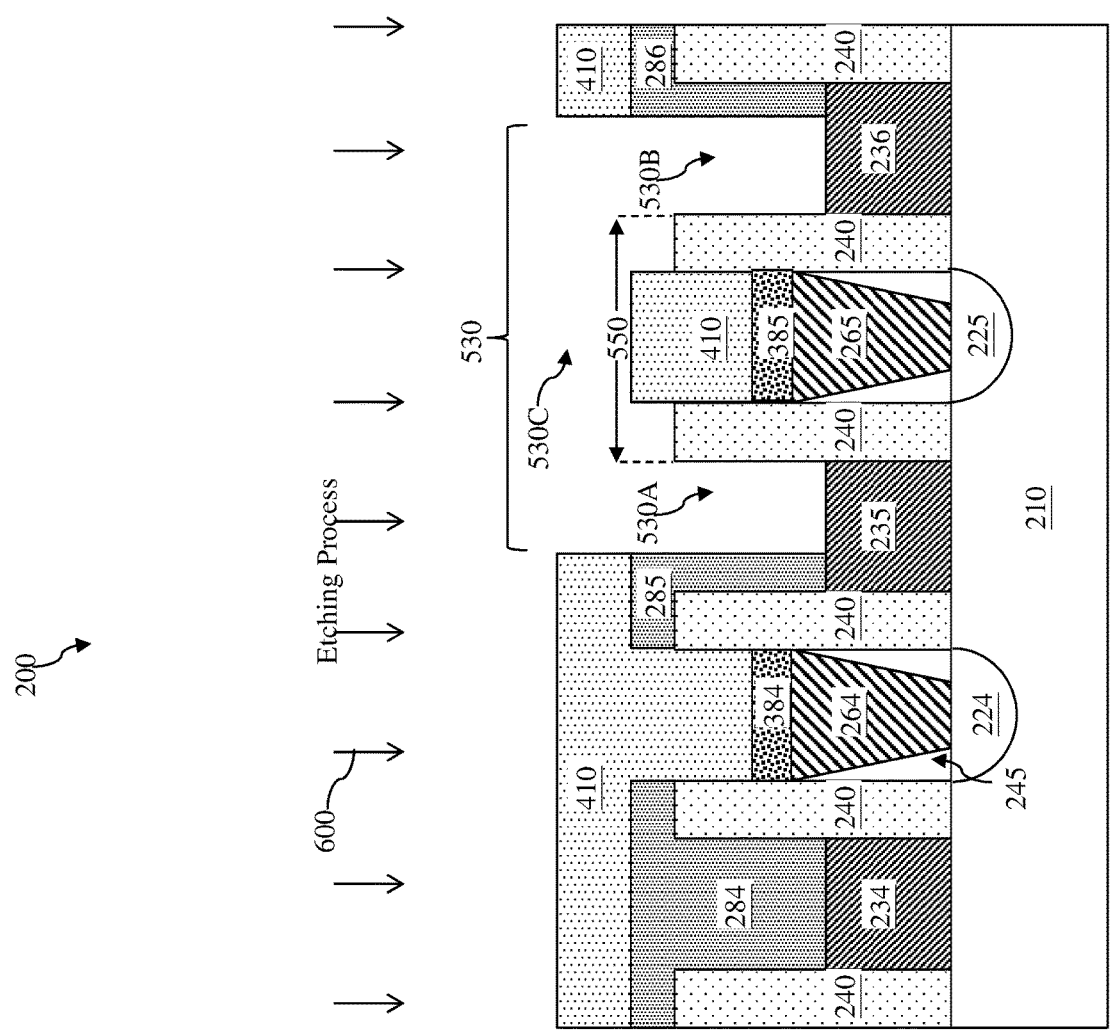

Referring now to FIGS. 9-10, an etching process 600 is performed to the semiconductor device 200. The etching process 600 etches away the segments 380-382 and 385 that are exposed, and thus "breaks through" the openings 430 and 521. Due to the etching selectivity between the segments 380-385 and the gate helmets 280-286 and the layer 410, the gate helmets 280-286 and the layer 410 are substantially unaffected by the etching process 600. The conductive contacts 260-262 and portions of the gate structures 230, 232, 235, and 236 are exposed after the performance of the etching process 600.

Figure 11:
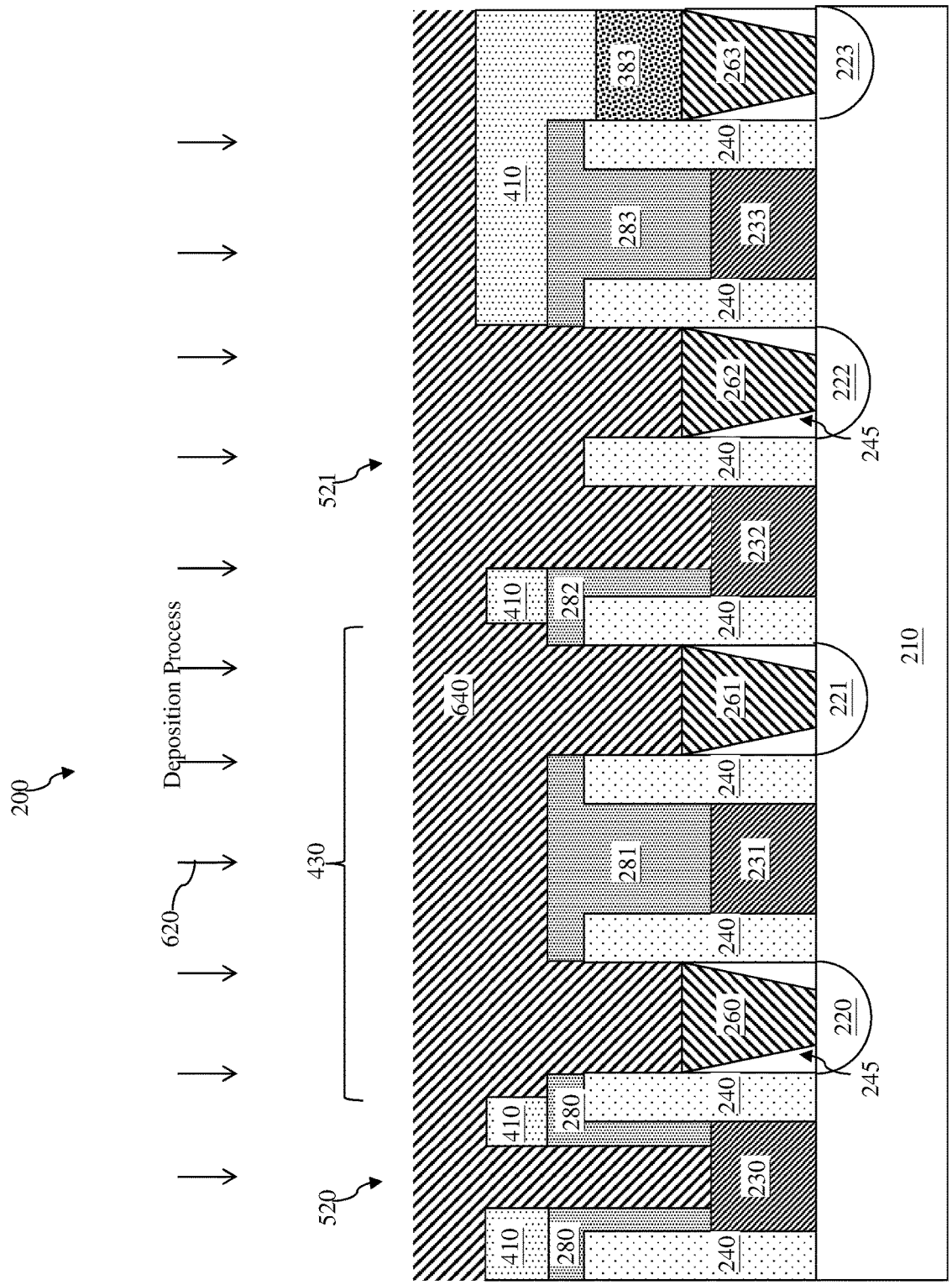
Figure 12:
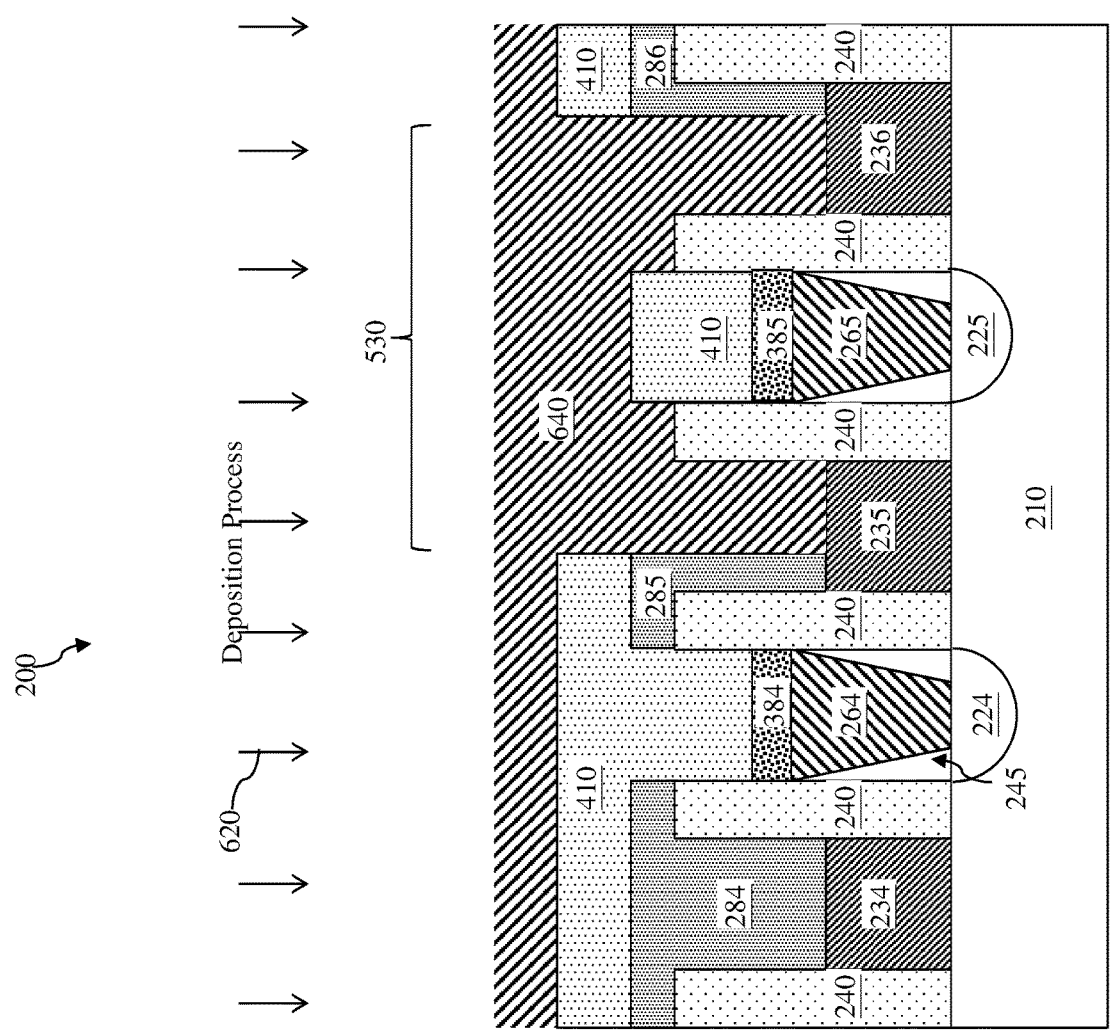

Referring now to FIGS. 11-12, a deposition process 620 is performed to the semiconductor device 200 to form a conductive material 640 thereover. The conductive material fills in the openings 520-521, 430, and 530. The conductive material 640 may include a metal material having good electrical conductivity and good gap filling characteristics. In some embodiments, the conductive material 640 includes tungsten.

Figure 13:
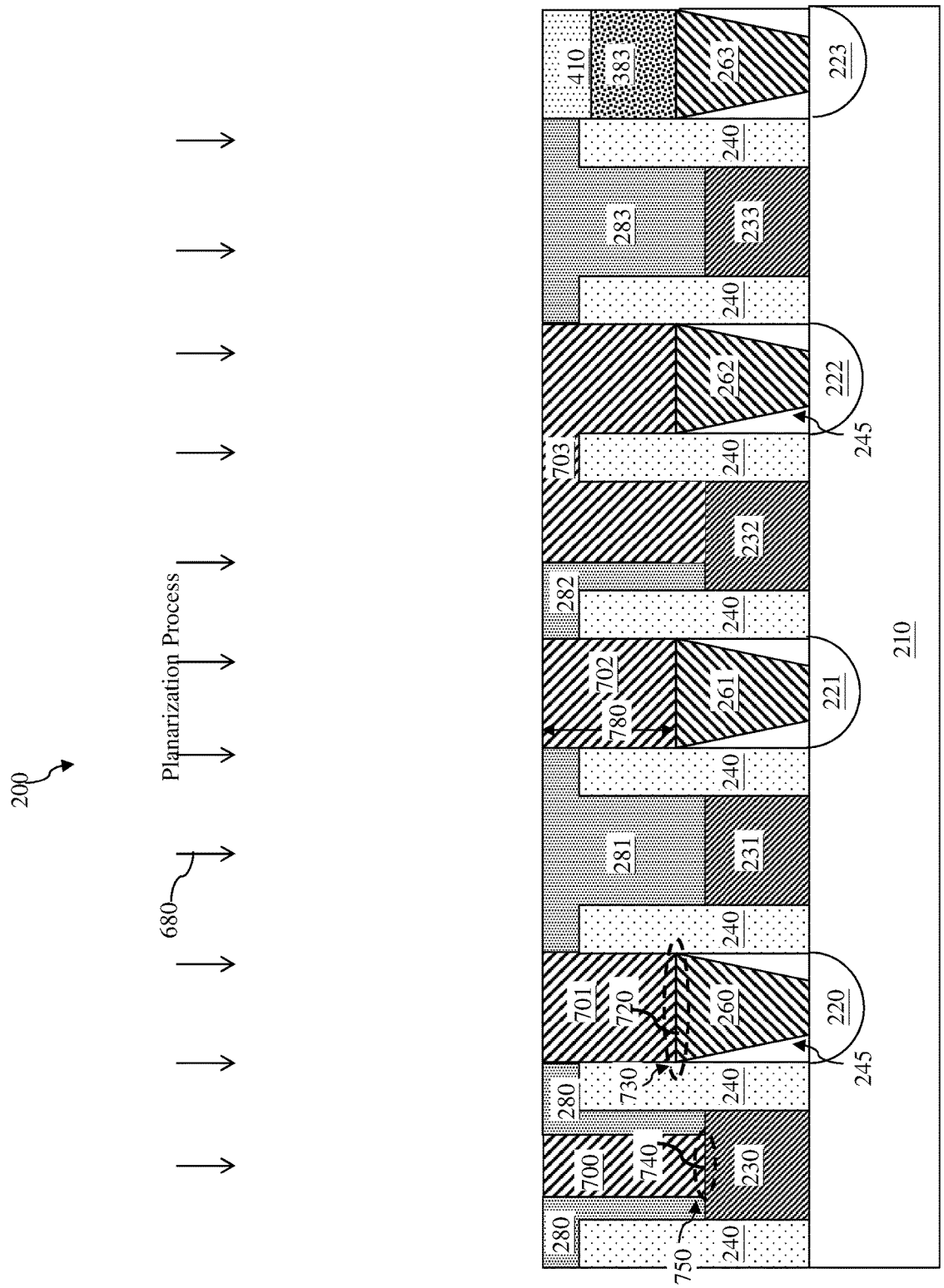
Figure 14:
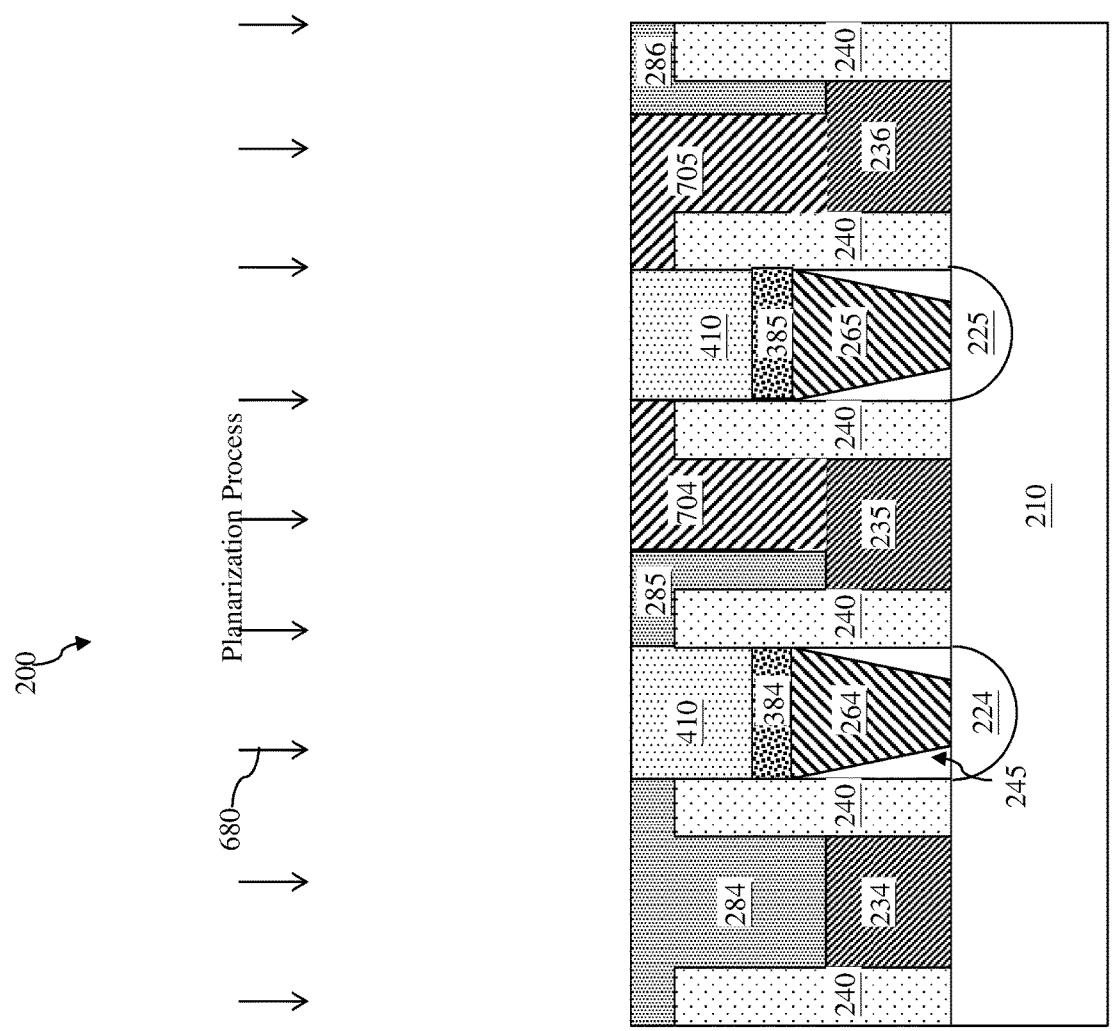

Referring now to FIGS. 13-14, a planarization process 680 is performed to the semiconductor device 200. In some embodiments, the planarization process 680 includes a polishing process, such as a CMP process. The planarization process 680 polishes and/or etches away portions of the conductive material 640 and portions of the layer 410 until the gate helmets 280-286 are reached. In other words, the gate helmets 280-286 are configured to serve as a polishing stop layer in the planarization process 680.

As a result of the planarization process 680, vias or contacts 700-705 are formed by the remaining portions of the conductive material 640. For example, as shown in FIG. 13, a gate contact 700 (also referred to as a VG contact) is formed over the gate structure 230. A via 701 (also referred to as a VD via) and a via 702 are formed over the conductive contacts 260 and 261, respectively. A via 703 (also referred to as a slot contact) is formed over the gate structure 232 and the conductive contact 262, thereby electrically interconnecting the gate structure 232 and the conductive contact 262. As discussed above, the "bridging" of the gate structure 232 and the conductive contact 262 provided by the via or slot contact 703 is by design. The portion of the slot contact 703 located over the conductive contact 262 may serve as a VD rail in certain IC applications, such as in SRAM devices. Also as shown in FIG. 14, a gate contact 704 and a gate contact 705 are formed over the gate structures 235 and 236, respectively.

Due to the unique fabrication process flow discussed above, the planarization process 680 eliminates bridging risks. For example, in FIG. 13, the portion of the conductive material 640 disposed above the vias 701-702 are removed by the planarization process 680, which eliminates the risk of the vias 701-702 bridging together. Thus, it may be said that the present disclosure prevents the bridging of VD vias. Meanwhile, the slot contact 703 is supposed to electrically interconnect with both the gate structure 232 and the conductive contact 262, and the planarization process 680 does not cut off, but rather preserves, this intended interconnection. As shown in FIG. 14, the portion of the conductive material 640 disposed above the gate contacts 704-705 are also removed by the planarization process 680, which eliminates the risk of the gate contacts 704-705 bridging together. Thus, the present disclosure prevents the bridging of VG contacts in addition to preventing the bridging of VD vias.

Due to the unique fabrication process flow, the semiconductor device 200 may have several distinct physical characteristics compared to conventional devices. One of the distinct physical characteristics of the semiconductor device 200 herein is that, other than the gate spacers 240, the electrical isolation between the gate contacts and vias is provided by a dielectric structure comprising a single type of dielectric material. For example, the gate helmets 280-286 may be considered such a dielectric structure, which comprises silicon nitride. In comparison, semiconductor devices formed by conventional fabrication processes may need several different dielectric layers formed over one another (each having its own dielectric material composition different from the others) to provide the electrical isolation between the gate contacts and vias. In this manner, the device structure of the semiconductor device 200 is simplified compared to conventional devices.

Another one of these physical characteristics is the difference in the interface areas between the gate structures and the VG contacts formed thereabove and between the conductive contacts and the VD vias formed thereabove. For example, referring to FIG. 13, the conductive contact 260 (as an example one of the conductive contacts) has an upper surface area 720 in the cross-sectional view herein, and the conductive contact 260 and the via 701 have an interface 730. The interface 730 occupies, or constitutes, an M percentage of the upper surface area 720 in the cross-sectional view. In some embodiments, M approaches, or is substantially equal to, 100%. This high percentage of overlap between the interface 730 and the upper surface area 720 is attributed at least in part to the unique fabrication process flow, which as discussed above "self aligns" the VD vias (such as the via 701) to their respective contacts (such as the conductive contact 260).

Meanwhile, the gate structure 230 (as an example one of the gate structures) has an upper surface area 740 in the cross-sectional view of FIG. 13, and the gate contact 700 and the gate structure 230 form an interface 750. The interface 750 occupies, or constitutes, an N percentage of the upper surface area 740 in the cross-sectional view. N is substantially less than 100%, since the bottom surfaces of the gate helmets 280 also occupy portions of the upper surface area 740 of the gate structure 230. As such, M is substantially greater than N. In some embodiments, a ratio of M:N is in a range between about 1.8:1 and about 1.4:1.

Yet another unique physical characteristic of the semiconductor device 200 is that different types of dielectric materials are formed over the gate structures and over the conductive contacts that do not have vias formed thereon. For example, the gate helmets 280-286 formed over the gate structures 230-236 may be silicon nitride. But the dielectric segment 383 and layer 410—formed over the conductive contact 263—include zirconium oxide and silicon oxide, respectively. The same is true for the conductive contacts 264-265 and the dielectric materials formed thereon. In comparison, conventional semiconductor devices typically have the same dielectric materials (or at least some of the same materials) formed over the gate structures and over the conductive contacts.

A further unique physical characteristic of the semiconductor device 200 is the reduced height of the vias. For example, as shown in FIG. 13, the via 702 has a via height 780, which is measured from an upper surface of the via 702 to a bottom surface of the via 702. Due to the unique fabrication process flow discussed above, fewer dielectric layers remain in the final structure compared to conventional processes. As such, after the planarization process 680 is performed, the height 780 is typically significantly smaller than the height of vias fabricated under conventional processes. In some embodiments, the height 780 is in a range between about 15 nm and about 23 nm, whereas the height of similar vias for conventional semiconductor devices may typically exceed 30 nm. It is understood that the height of the slot contact 703 and the gate contacts (e.g., gate contact 700) are reduced in the present disclosure for similar reasons. The shorter via height (and wider via width) corresponds to better gap filling performance (and less chance of bubbles or voids being trapped within the vias), as well as reduced electrical resistivity.

The various aspects of the present disclosure may apply to a wide variety of semiconductor IC applications, including but not limited to, SRAM cells and/or standard logic cells. For example, the slotted contact 703 may be implemented as a body contact (BCT) or a linking contact in SRAM cells. The vias such as vias 701-702 may also be used to implement VD rails in standard logic circuit cell arrays. Additional details regarding SRAM cells or standard logic cells can be found in U.S. patent application Ser. No. 15/492,777, entitled "FinFET SRAM Having Discontinuous PMOS Fin Lines", the disclosure of which is hereby incorporated by reference in its entirety. It is also understood that the various aspects of the present disclosure may apply to traditional planar transistors as well as the more recently developed three-dimensional FinFET transistors. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety. For reasons of simplicity, the details of SRAM cells, standard logic cells, or FinFET transistors are not specifically discussed herein.

Figure 15:
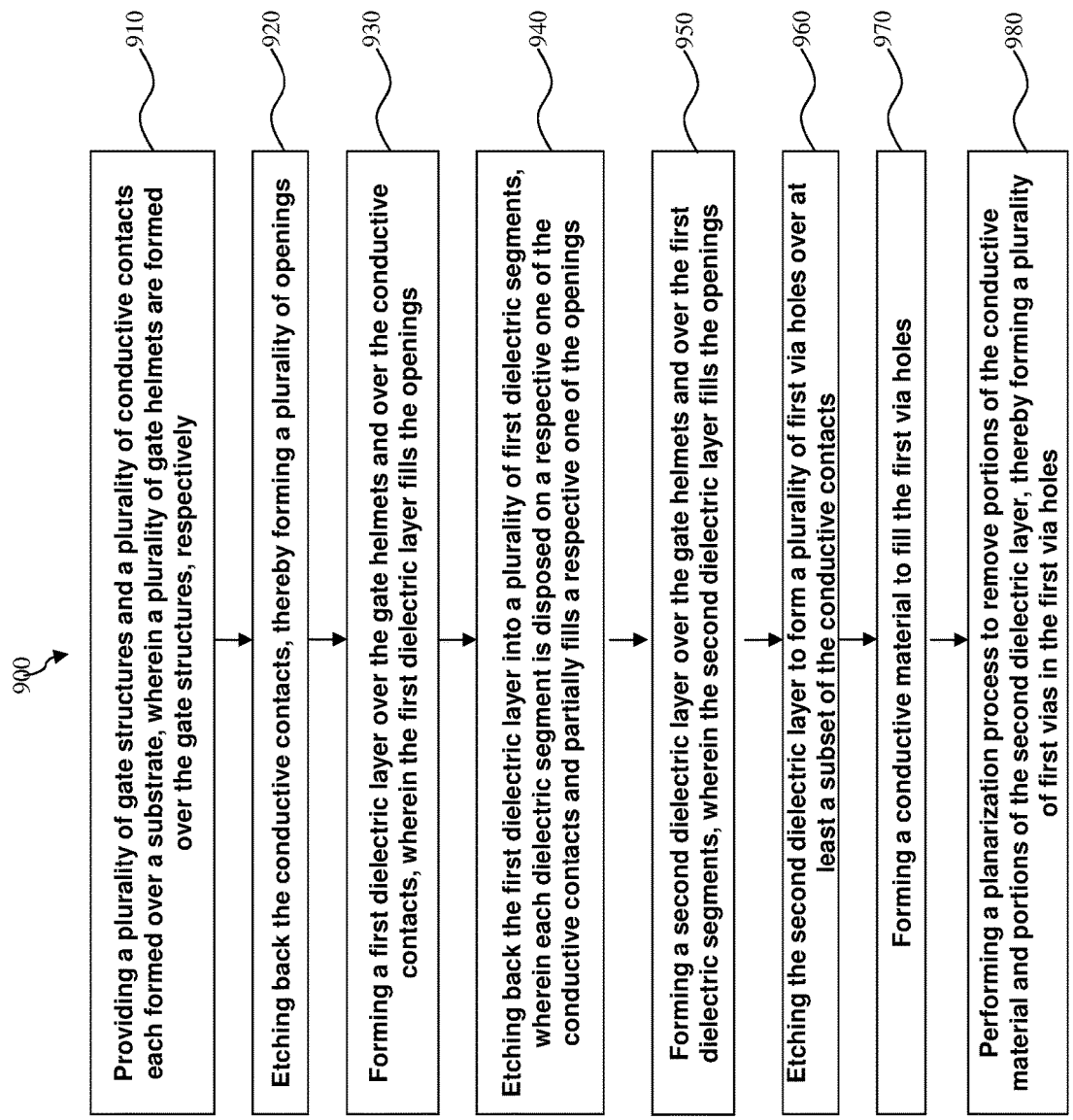
FIG. 15 is a flowchart illustrating a method of fabricating a semiconductor device according to an embodiment of the present disclosure.

FIG. 15 is a flowchart illustrating a method 900 according to an embodiment of the present disclosure. The method 900 includes a step 910 of providing a plurality of gate structures and a plurality of conductive contacts each formed over a substrate. A plurality of gate helmets are formed over the gate structures, respectively.

The method 900 includes a step 920 of etching back the conductive contacts, thereby forming a plurality of openings.

The method 900 includes a step 930 of forming a first dielectric layer over the gate helmets and over the conductive contacts. The first dielectric layer fills the openings.

The method 900 includes a step 940 of etching back the first dielectric layer into a plurality of first dielectric segments. Each dielectric segment is disposed on a respective one of the conductive contacts and partially fills a respective one of the openings.

The method 900 includes a step 950 of forming a second dielectric layer over the gate helmets and over the first dielectric segments. The second dielectric layer fills the openings.

The method 900 includes a step 960 of etching the second dielectric layer to form a plurality of first via holes over at least a subset of the conductive contacts.

The method 900 includes a step 970 of forming a conductive material to fill the first via holes.

The method 900 includes a step 980 of performing a planarization process to remove portions of the conductive material and portions of the second dielectric layer, thereby forming a plurality of first vias in the first via holes.

In some embodiments, at least some of the first via holes bridge (FIG. 6, #430C) with one another after the etching the second dielectric layer.

In some embodiments, the first dielectric segments have an etching selectivity with the second dielectric layer and prevent the conductive contacts underneath from being etched during the etching back the first dielectric layer or during the etching the second dielectric layer.

In some embodiments, the planarization process is performed until the gate helmets are reached.

In some embodiments, the gate helmets comprise silicon nitride, the first dielectric layer comprises zirconium oxide, and the second dielectric layer comprises silicon oxide.

It is understood that additional processes may be performed before, during, or after the steps 910-980 of the method 900. For example, after the etching the second dielectric layer but before the forming the conductive material, the method 900 further includes a step of etching the second dielectric layer and the gate helmets to form a plurality of second via holes over at least a subset of the gate structures. The forming of the conductive material fills the second via holes, and the performing of the planarization process forms a plurality of second vias in the second via holes. In some embodiments, the gate structures include a first gate structure, the conductive contacts include a first conductive contact, at least one of the second via holes is etched to span laterally over the first gate structure and the first conductive contact, and a slotted contact is formed in the at least one of the second via holes, the slotted contact electrically interconnecting the first gate structure and the first conductive contact. The method 900 may further include steps such as forming additional metal layers, testing, packaging, etc. For reasons of simplicity, other additional steps are not discussed herein in detail.

In summary, the present disclosure pertains to a unique fabrication process flow to form vias for conductive contacts and to form gate contacts for gate structures of a semiconductor device. The unique fabrication process flow cuts off portions of a conductive material that could have caused electrical bridging between two adjacent vias or gate contacts. As such, the present disclosure offers advantages over conventional devices. It is understood, however, that other embodiments may offer additional advantages, and not all advantages are necessarily disclosed herein, and that no particular advantage is required for all embodiments. One advantage is that the present disclosure prevents or reduces the bridging risks. As semiconductor device feature sizes continue to shrink, it may be difficult for lithography to accurately resolve the via openings (or gate contact openings) that are located too close to one another. Under conventional fabrication approaches, these via openings could bridge with one another, thereby causing the final device to have electrical shorting defects. The present disclosure's unique process flow prevents such bridging problems by self-aligning the vias with the source/drain contacts and the using a polishing process to cut off portions of the conductive material that could bridge two adjacent vias (or gate contacts). Another benefit is that while preventing the unintentional bridging between vias or gate contacts, the present disclosure nevertheless can still preserve the formation of slot contacts, which are designed to "bridge" a gate structure and a source/drain contact together. Slot contacts may be used in certain IC applications such as SRAM cells. Another advantage is that the self-aligned vias formed herein have better electrical performance compared to conventional devices, for example with respect to electrical resistivity. Other advantages include compatibility with existing semiconductor device design and manufacture, so the present disclosure does not require additional processing and is therefore easy and cheap to implement.

One aspect of the present disclosure pertains to a semiconductor device. A first gate structure and a second gate structure are each disposed over a substrate. A first conductive contact and a second conductive contact are each disposed over the substrate. A first via is disposed over the first conductive contact. A second via is disposed over the second conductive contact. A first gate contact is disposed over the first gate structure. A dielectric structure is disposed over the first gate structure and over the second gate structure. A first portion of the dielectric structure is disposed between, and electrically isolates, the first via from the second via. A second portion of the dielectric structure is disposed between, and electrically isolates, the first via from the first gate contact. The first portion and the second portion of the dielectric structure each comprise a single type of dielectric material. A first interface between the first conductive contact and the first via constitutes a first percentage of an upper surface area of the first conductive contact in a cross-sectional view. A second interface between the first gate structure and the first gate contact constitutes a second percentage of an upper surface area of the first gate structure in the cross-sectional view. The first percentage is greater than the second percentage.

Another one aspect of the present disclosure pertains to a semiconductor device. A plurality of gate structures is disposed over a substrate. A plurality of conductive contacts is disposed over the substrate. A plurality of gate contacts is disposed over a first subset of the gate structures. A first dielectric material is disposed over a second subset of the gate structures. A plurality of vias is disposed over a first subset of the conductive contacts. A second dielectric material is disposed over a second subset of the conductive contacts. A third dielectric material is disposed over the second dielectric material. The first dielectric material, the second dielectric material, and the third dielectric material have different material compositions from one another. In a cross-sectional view: each of the vias occupies a first percentage of an upper surface area of the conductive contact disposed therebelow; each of the gate contacts occupies a second percentage of an upper surface area of the gate structure disposed therebelow; and the first percentage is greater than the second percentage.

Another one aspect of the present disclosure pertains to a method of fabricating a semiconductor device. A plurality of gate structures and a plurality of conductive contacts are each formed over a substrate, wherein a plurality of gate helmets are formed over the gate structures, respectively. The conductive contacts are etched back, thereby forming a plurality of openings. A first dielectric layer is formed over the gate helmets and over the conductive contacts, wherein the first dielectric layer fills the openings. The first dielectric layer is etched into a plurality of first dielectric segments, wherein each dielectric segment is disposed on a respective one of the conductive contacts and partially fills a respective one of the openings. A second dielectric layer is formed over the gate helmets and over the first dielectric segments, wherein the second dielectric layer fills the openings. The second dielectric layer is etched to form a plurality of first via holes over at least a subset of the conductive contacts. A conductive material is formed to fill the first via holes. A planarization process is performed to remove portions of the conductive material and portions of the second dielectric layer, thereby forming a plurality of first vias in the first via holes.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
   a first gate structure disposed over a substrate;
   a first gate helmet disposed over the first gate structure;
   a first gate contact disposed over the first gate structure, wherein the first gate contact is surrounded by the first gate helmet;
   a first conductive contact disposed over the substrate;
   a dielectric structure disposed over the first conductive contact, wherein the dielectric structure and the first gate helmet contain different types of dielectric materials;
   a second gate structure disposed over the substrate; and
   a second gate helmet disposed over the second gate structure, wherein a bottom surface of the second gate helmet is disposed over an entirety of an upper surface of the second gate structure, and wherein the second gate helmet has a substantially wider bottom surface than the first gate helmet.

2. The semiconductor device of claim 1, wherein:
   the first gate helmet has a first dielectric material composition;
   the dielectric structure includes a first dielectric component having a second dielectric material composition and a second dielectric component having a third dielectric material composition; and
   the first dielectric material composition, the second dielectric material composition, and the third dielectric material composition are different from one another.

3. The semiconductor device of claim 2, wherein:
   the first dielectric material composition includes silicon nitride;
   the second dielectric material composition includes zirconium oxide; and
   the third dielectric material composition includes silicon oxide.

4. The semiconductor device of claim 1, further comprising first gate spacers that are disposed on side surfaces of the first gate structure and on side surfaces of the first gate helmet.

5. The semiconductor device of claim 4, wherein at least a portion of the first gate helmet is disposed over the first gate spacers.

6. The semiconductor device of claim 1,
   wherein:
   the second gate helmet has a same material composition as the first gate helmet.

7. The semiconductor device of claim 1, further comprising:
   a second conductive contact disposed over the substrate; and
   a conductive via disposed over the second conductive contact;
   wherein the first conductive contact and the second conductive contact have a same material composition.

8. The semiconductor device of claim 7, wherein:
   the first conductive contact is disposed over a first source/drain region; and
   the second conductive contact is disposed over a second source/drain region.

9. The semiconductor device of claim 7, wherein the conductive via has a height that is in a range between about 15 nanometers and about 23 nanometers.

10. The semiconductor device of claim 7, wherein:
the first gate structure and the first gate contact form a first interface that occupies a first percentage of an upper surface area of the first gate structure;
the second conductive contact and the conductive via form a second interface that occupies a second percentage of an upper surface area of the second conductive contact; and
the second percentage is substantially greater than the first percentage.

11. The semiconductor device of claim 10, wherein a ratio of the second percentage and the first percentage is in a range between about 1.8:1 and about 1.4:1.

12. The semiconductor device of claim 1, wherein an entirety of an upper surface of the first gate structure is in direct contact with the first gate helmet and the first gate contact collectively.

13. A semiconductor device, comprising:
a first gate structure and a second gate structure disposed over a substrate, wherein the first gate structure and the second gate structure each contains a respective gate electrode;
a first gate helmet and a first gate contact disposed over the first gate structure, wherein the first gate helmet contains a first type of dielectric material;
a second gate helmet disposed over and directly contacting the gate electrode of the second gate structure, wherein a bottom surface of the second gate helmet is substantially wider than a bottom surface of the first gate helmet;
a first conductive contact and a second conductive contact disposed over the substrate;
a dielectric structure disposed over the first conductive contact, wherein the dielectric structure contains a second type of dielectric material and a third type of dielectric material that are each different from the first type of dielectric material; and
a conductive via disposed over the second conductive contact.

14. The semiconductor device of claim 13, further comprising:
a third gate structure disposed over the substrate;
a third conductive contact disposed over the substrate; and
a slot contact disposed over, and electrically coupled to, both the third gate structure and the third conductive contact.

15. A semiconductor device, comprising:
a first gate structure disposed over a substrate;
a first gate helmet disposed over the first gate structure, wherein the first gate helmet includes a first type of dielectric material;
a first gate contact disposed over the first gate structure, wherein both a first side and a second side of the first gate contact are surrounded by, and come into direct contact with, the first gate helmet, the second side being opposite the first side in a cross-sectional view, and wherein a first portion of the first gate helmet located on the first side of the first gate contact has a substantially same depth as a second portion of the first gate helmet located on the second side of the first gate contact in the cross-sectional view;
first gate spacers that are disposed on side surfaces of the first gate structure and on side surfaces of the first gate helmet, wherein at least a portion of the first gate helmet is disposed over the first gate spacers;
a first source/drain contact disposed over the substrate; and
a dielectric structure disposed over the first source/drain contact, wherein the first gate helmet includes a second type of dielectric material and a third type of dielectric material that are each different from the first type of dielectric material.

16. The semiconductor device of claim 15, wherein:
the first type of dielectric material includes silicon nitride;
the second type of dielectric material includes zirconium oxide; and
the third type of dielectric material includes silicon oxide.

17. The semiconductor device of claim 15, further comprising:
a second gate structure disposed over the substrate;
a second gate helmet disposed over the second gate structure, wherein the second gate helmet has a same material composition as the first gate helmet and has a substantially wider bottom surface than the first gate helmet, and wherein a bottom surface of the second gate helmet is disposed over an entirety of an upper surface of the second gate structure;
a second source/drain contact disposed over the substrate, wherein the first source/drain contact and the second source/drain contact have a same material composition; and
a conductive via disposed over the second source/drain contact.

18. The semiconductor device of claim 17, wherein:
the first gate structure and the first gate contact form a first interface that occupies a first percentage of an upper surface area of the first gate structure;
the second source/drain contact and the conductive via form a second interface that occupies a second percentage of an upper surface area of the second source/drain contact; and
the second percentage is greater than the first percentage.

19. The semiconductor device of claim 15, wherein an entirety of an upper surface of the first gate structure is in direct contact with the first gate helmet and the first gate contact collectively.

20. The semiconductor device of claim 15, wherein a substantial entirety of sidewalls of the first gate contact on both the first side and the second side are in direct contact with the first gate helmet.

* * * * *